(12) United States Patent
Chen

(10) Patent No.: US 10,768,715 B2
(45) Date of Patent: Sep. 8, 2020

(54) LINE CONTROL DEVICE AND LINE CONTROL METHOD FOR USER TERMINAL

(71) Applicant: SHENZHEN ROYOLE TECHNOLOGIES CO. LTD., Shenzhen, Guangdong (CN)

(72) Inventor: Shuangxin Chen, Guangdong (CN)

(73) Assignee: SHENZHEN ROYOLE TECHNOLOGIES CO., LTD., Shenzhen (CN)

(*) Notice: Subject to any disclaimer, the term of this patent is extended or adjusted under 35 U.S.C. 154(b) by 17 days.

(21) Appl. No.: 16/303,264

(22) PCT Filed: Nov. 22, 2016

(86) PCT No.: PCT/CN2016/106756
§ 371 (c)(1),
(2) Date: Nov. 20, 2018

(87) PCT Pub. No.: WO2018/094557
PCT Pub. Date: May 31, 2018

(65) Prior Publication Data
US 2019/0204935 A1    Jul. 4, 2019

(51) Int. Cl.
*G06F 3/0338* (2013.01)
*H03K 17/945* (2006.01)
(Continued)

(52) U.S. Cl.
CPC .......... *G06F 3/0338* (2013.01); *G06F 3/0414* (2013.01); *G06F 3/0416* (2013.01);
(Continued)

(58) Field of Classification Search
CPC .......... G06F 3/014; G06F 3/017; G06F 1/163; G06K 9/00355
See application file for complete search history.

(56) References Cited

U.S. PATENT DOCUMENTS

| | | | |
|---|---|---|---|
| 2005/0030310 A1* | 2/2005 | Hunter | G06T 19/20 345/473 |
| 2007/0131445 A1* | 6/2007 | Gustavsson | H04M 1/6058 174/74 R |

(Continued)

FOREIGN PATENT DOCUMENTS

| | | |
|---|---|---|
| CN | 103513769 A | 1/2014 |
| CN | 105578334 A | 5/2016 |

(Continued)

OTHER PUBLICATIONS

International search report dated Jul. 28, 2017 from corresponding application No. PCT/CN2016/106756.

*Primary Examiner* — Muhammad N Edun
(74) *Attorney, Agent, or Firm* — Hauptman Ham, LLP

(57) ABSTRACT

A line control device and a line control method for a user terminal are operated to control the user terminal. The line control device includes a flexible body, a control unit arranged in the flexible body, and a first deformation detection unit arranged along a first axis of the flexible body. The first deformation detection unit is electronically connected to the control unit. The first deformation detection unit is operated to detect a deformation of the flexible body with respect to the first axis. The control unit is operated to control the user terminal according to a deformation of the flexible body with respect to the first axis.

19 Claims, 6 Drawing Sheets

(51) Int. Cl.
  *H04R 1/10*  (2006.01)
  *G06F 3/041*  (2006.01)
  *H03K 17/96*  (2006.01)

(52) U.S. Cl.
  CPC ....... *H03K 17/945* (2013.01); *H03K 17/9625* (2013.01); *H04R 1/10* (2013.01); *H04R 1/1041* (2013.01); *G06F 2203/04102* (2013.01); *H03K 2017/9455* (2013.01)

(56) References Cited

U.S. PATENT DOCUMENTS

2010/0056223 A1  3/2010  Choi et al.
2016/0094907 A1  3/2016  Xiao et al.

FOREIGN PATENT DOCUMENTS

CN   105892984 A    8/2016
EP   2784626 A2 *  10/2014  ............. G06F 1/136

* cited by examiner

US 10,768,715 B2

LINE CONTROL DEVICE AND LINE CONTROL METHOD FOR USER TERMINAL

RELATED APPLICATION

The present application is a National Phase of International Application Number PCT/CN2016/106756, filed Nov. 22, 2016.

TECHNICAL FIELD

The present disclosure relates to an electronic device, and more particularly relates to a line control device and a line control method for a user terminal.

BACKGROUND

The line control device brings great convenience to user terminals, such as a smart phone, a tablet computer, and so on. For example, a line control device applied in an earphone line of a user terminal can be used to control functions of the user terminal, such as answering or rejecting a call, switching songs, adjusting volume, and so on. However, most existing line control devices are button-type control devices made of hard material, or touch-type control devices with touch panels arranged at hard material. To control functions of the user terminals through these line control devices, specific button combinations or touch gestures are required. When the line control device is out of sight of the user, touch operations are required to locate the corresponding button and the touch panel. Thus, the operation efficiency of the existing line control device is limited. In addition, the existing line control device has too few operation gestures to achieve a richer function control.

SUMMARY

In view of the above problems, embodiments of the present disclosure provide a line control device and a line control method for a user terminal, to enrich operation gestures for performing functional controls on the user terminal and to improve the user's experience.

A line control device is operated to control a user terminal. The line control device includes a flexible body, a control unit arranged in the flexible body, and a first deformation detection unit arranged along a first axis of the flexible body. The first deformation detection unit is electronically connected to the control unit. The first deformation detection unit is operated to detect a deformation of the flexible body with respect to the first axis. The control unit is further operated to control the user terminal according to a deformation of the flexible body with respect to the first axis.

A line control method is operated to control a user terminal. The line control method includes detecting a deformation of a flexible body of the user terminal with respect to a first axis of the flexible body; and triggering, according to a deformation of the flexible body with respect to the first axis, a control unit of the user terminal to control the user terminal.

The line control device arranges the first deformation detection unit in the flexible body, and the first deformation detection unit is arranged along the first axis of the flexible body, so that a deformation of the flexible body with respect to the first axis can be detected by the first deformation detection module and the control unit is triggered, according to a deformation of the flexible body with respect to the first axis, to control the user terminal accordingly. Therefore, the function control of the user terminal performed by the line control device, a pressure may be directly applied to the flexible body along the first axis, without considering the position of keys or the position of touch panels, which will be benefit to enrich the line control operation gestures, and improve the function control efficiency and the user's experience.

BRIEF DESCRIPTION OF THE DRAWINGS

To better illustrate the embodiment of the present disclosure, a brief description of the accompanying drawing for use with the illustration of the embodiments is provided below.

DETAILED DESCRIPTION

The technical solutions of embodiments of the present disclosure will be described clearly and completely in combination with the accompanying drawings of the embodiments of the present disclosure. Obviously, the described embodiments are merely a part of embodiments of the present disclosure, but not all of the embodiments. All other embodiments obtained by those skilled in the art without creative efforts based on the embodiments of the present disclosure shall fall within the protection scope of the present disclosure.

Figure 1:
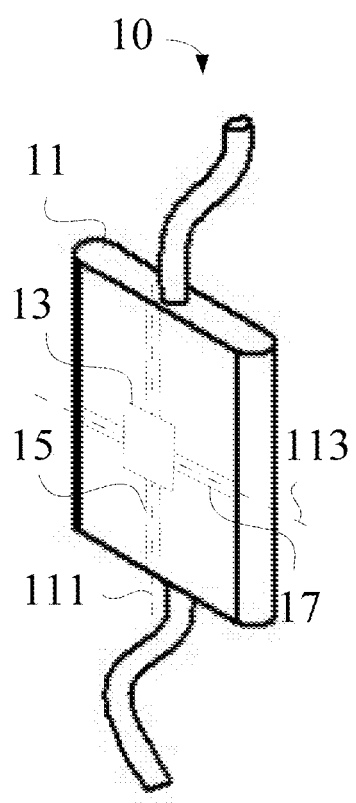
FIG. 1 is a first schematic structure diagram of a line control device in accordance with an embodiment of the present disclosure.
Figure 2:
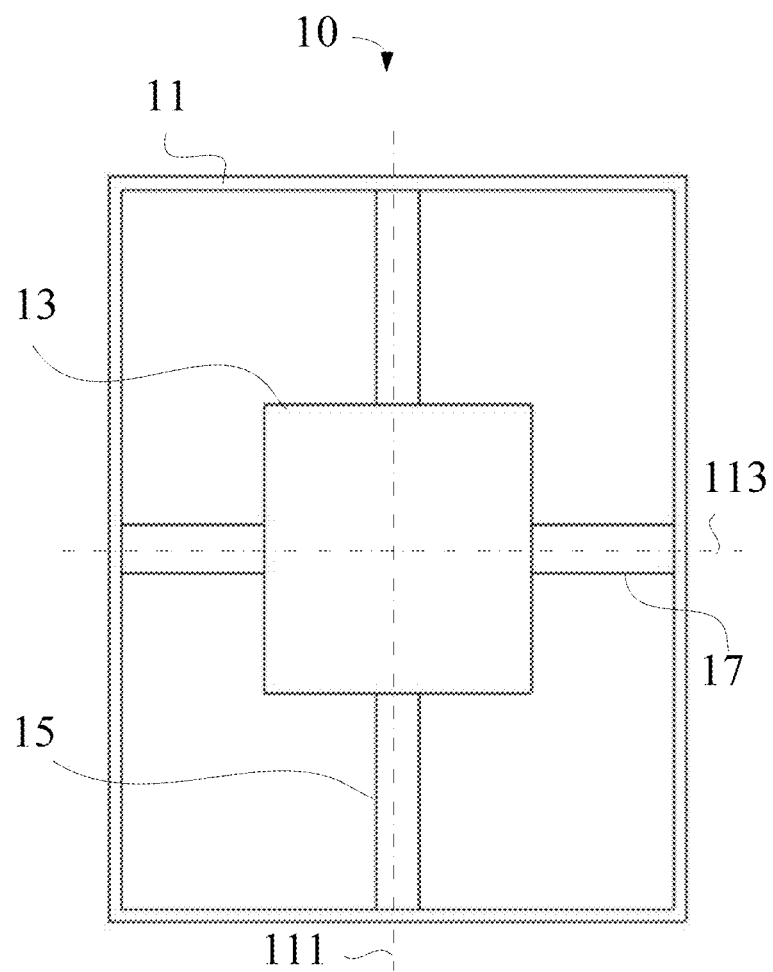
FIG. 2 is a second schematic structure diagram of a line control device in accordance with an embodiment of the present disclosure.

Referring to FIG. 1 and FIG. 2, in one embodiment of the present disclosure, a line control device 10 is provided to connect to a user terminal (not illustrated). The line control device 10 is operated to control the user terminal. The line control device 10 includes a flexible body 11, a control unit 13 arranged in the flexible body 11, a first deformation detection unit 15 arranged along a first axis 111 of the flexible body 11, and a second deformation detection unit 17 arranged along a second axis 113 of the flexible body 11. The first deformation detection unit 15 and the second deformation detection unit 17 are both electrically connected to the control unit 13. The first deformation detection unit 15 is operated to detect a deformation of the flexible body 11 with respect to the first axis 111, and trigger, according to a deformation of the flexible body 11 with respect to the first axis 111, the control unit 13 to control the user terminal. The second deformation detection unit 17 is operated to detect a deformation of the flexible body 11 with respect to the second axis 113, and trigger, according to a deformation of the flexible body 11 with respect to the second axis 113, the control unit 13 to control the user terminal. The first axis 111 intersects with the second axis 113.

The line control device 10 is applied in an earphone and a communication is established between the line control device 10 and the earphone through a wired communication interface (such as a 3.5 mm earphone jack, a USB type-C interface, or a lighting interface) or a wireless communication interface (such as Bluetooth). The user terminal may be a smart phone, a tablet computer, or the like. The flexible body 11 is made of flexible material, such as polyvinyl (PVC), polyethylene (PE), plyperfluoroethylene (F46), neoprene rubber, or silicone rubber, and so on. It can be understood that the control of the user terminal by the control unit 13 according to a deformation of the flexible body 11 with respect to the first axis 111 or with respect to the second axis 113 may be, but not limited to volume control, song switching, pausing/playing songs, starting voice assistant, or starting custom applications. A deformation can be characterized by a bending degree of the flexible body 11 with respect to the first axis 111 or the second axis 113. A deformation also can be characterized by a proximity of two opposite ends of the flexible body 11 along the first axis 111 or along the second axis 113.

Figure 3:
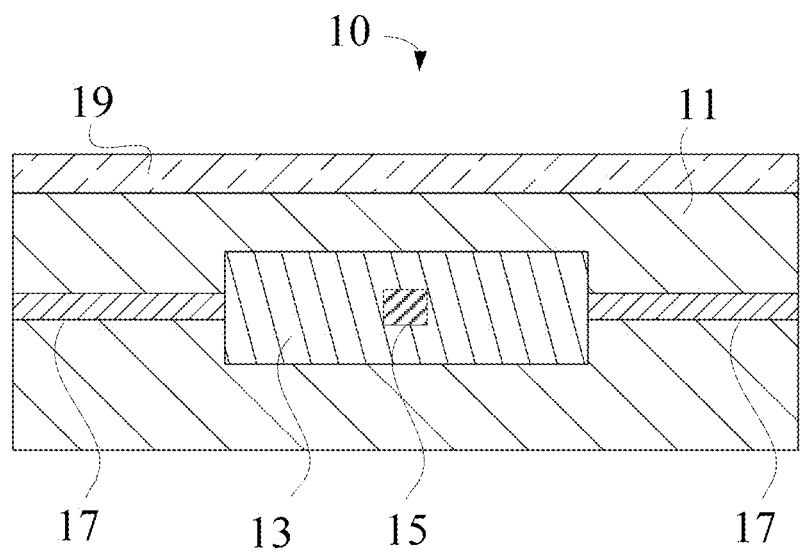
FIG. 3 is a third schematic structure diagram of a line control device in accordance with an embodiment of the present disclosure.

Referring to FIG. 3, the control unit 13, the first deformation detection unit 15, and the second deformation detection unit 17 are packaged in the flexible body 11 and integrally molded in one piece with the flexible body 11. It can be understood that, since the control unit 13 is made of rigid material, the control unit 13 may be arranged at a center of the flexible body 11, to prevent a damage caused by a deformation pressure exerting by the flexible body 11. In one embodiment, the line control device 10 may further include a flexible touch screen 19 electrically connect to the control unit 13. The flexible touch screen 19 at least partially covers a surface of the flexible body 11, which is operated to receive a touch control instruction for the line control device 10, and trigger, according to the touch control instruction, the control unit 13 to control the user terminal. It can be understood that the flexible touch screen 19 may be arranged at a top wall, a bottom wall, or a sidewall of the flexible body 11, or may fully cover the surface of flexible body 11. The touch control instruction may be, but is not limited to click, double-click, sliding, point sliding, and long-press. The control of the user terminal by the control unit 13 according to the touch control instruction may be, but not limited to volume control, song switching, pausing/playing songs, starting voice assistant, or starting custom application.

Referring to FIG. 2 again, in one embodiment, the first deformation detection unit 15 is a first flex sensor arranged along the first axis 111. The first flex sensor is operated to detect a bending degree of the flexible body 11 with respect to the first axis 111 towards a first direction, and trigger the control unit 13 according to the bending degree of the flexible body 11 along the first axis 111 towards the first direction to determine a first deformation of the flexible body 11 with respect to the first axis 111; or detect a bending degree of the flexible body 11 with respect to the first axis 111 towards a second direction, and trigger the control unit 13 according to the bending degree of the flexible body 11 along the first axis 111 towards the second direction to determine a second deformation of the flexible body 11 with respect to the first axis 111.

Figure 4:
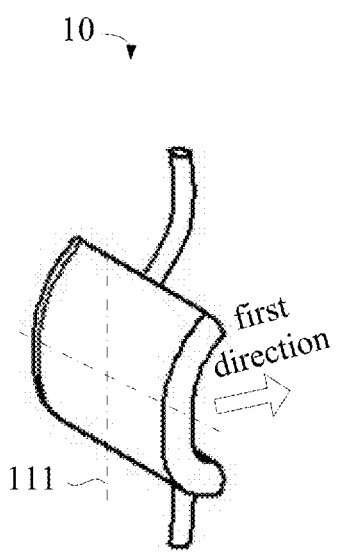
FIG. 4 is a schematic diagram of a line control device in accordance with an embodiment of the present disclosure, showing the line control device in a first state.
Figure 5:
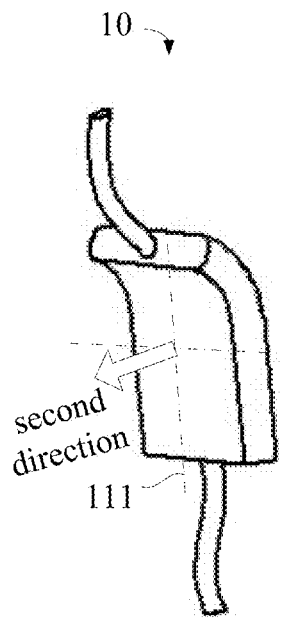
FIG. 5 is a schematic diagram of a line control device in accordance with an embodiment of the present disclosure, showing the line control device in a second state.

The first direction is opposite to the second direction. For example, the first direction and the second direction are opposite to each other and perpendicular to a plane defined by the first axis 111 and the second axis 113. In the embodiment, the first deformation of the flexible body 11 with respect to the first axis 111 is illustrated in FIG. 4, and the second deformation of the flexible body 11 with respect to the first axis 111 is illustrated in FIG. 5.

It can be understood that the control unit 13 may include a processor, a memory, and a peripheral signal processing circuit (not illustrated). Detection programs corresponding to different deformation may be preset in the memory, which is invoked and executed by the processor. At the same time, determined thresholds corresponding to different deformation, for example, bending degree thresholds, are preset in the memory. On a condition that the bending degree of the flexible body 11 with respect to the first axis 111 towards the first direction is greater than or equal to the bending degree threshold, a deformation of the flexible body 11 with respect to the first axis 111 is determined to be the first deformation. On a condition that the bending degree of the flexible body 11 with respect to the first axis 111 towards the second direction is greater than or equal to the bending threshold, a deformation of the flexible body 11 with respect to the first axis 111 is determined to be the second deformation.

The control unit 13 is further operated to transfer, according to the first deformation of the flexible body 11 with respect to the first axis 111, a first control instruction to the user terminal; or transfer, according to the second deformation of the flexible body 11 with respect to the first axis 111, a second control instruction to the user terminal.

The first control instruction and the second control instruction are respectively operated to control opposite functions of the user terminal, such as turning volume up and turning volume down, playing a last song and playing a next song, and so on.

For example, on a condition that a deformation of the flexible body 11 with respect to the first axis 111 is determined to be the first deformation, the control unit 13 is triggered to transfer a control instruction of playing a last song to the user terminal. On a condition that a deformation of the flexible body 11 with respect to the first axis 111 is determined to be the first deformation, the control unit 13 is triggered to transfer a control instruction of playing a next song to the user terminal.

The second deformation detection unit 17 is a second flex sensor arranged along the second axis 113. The second flex sensor is operated to detect a bending degree of the flexible body 11 with respect to the second axis 113 towards the first direction, and trigger, according to the bending degree of the flexible body 11 with respect to the second axis 113 towards the first direction, the control unit 13 to determine a third deformation of the flexible body 11 with respect to the second axis 113; or detect a bending degree of the flexible body 11 with respect to the second axis 113 towards the second direction, and trigger, according to the bending degree of the flexible body 11 with respect to the second axis 113 towards the second direction, the control unit 13 to determine a fourth deformation of the flexible body 11 with respect to the second axis 113.

Figure 6:
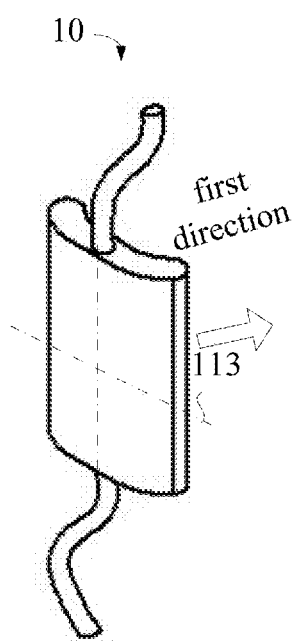
FIG. 6 is a schematic diagram of a line control device in accordance with an embodiment of the present disclosure, showing the line control device in a third state.
Figure 7:
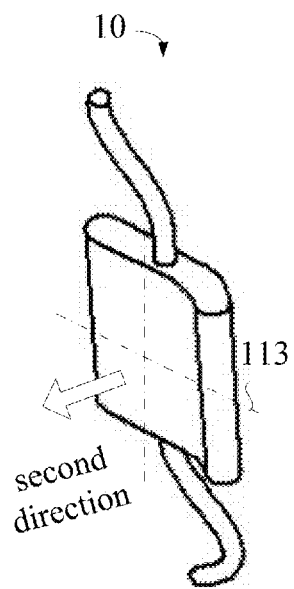
FIG. 7 is a schematic diagram of a line control device in accordance with an embodiment of the present disclosure, showing the line control device in a fourth state.

The first direction is opposite to the second direction. For example, the first direction and the second direction are opposite to each other and perpendicular to the plane defined by the first axis 111 and the second axis 113. In the embodiment, the third deformation of the flexible body 11 with respect to the second axis 113 is illustrated in FIG. 6, and the fourth deformation of the flexible body 11 with respect to the second axis 113 is illustrated in FIG. 7.

It can be understood that the control unit 13 may determine the fourth deformation of the flexible body 11 with respect to the second axis 113 according to the bending degree threshold preset. For example, on a condition that the bending degree of the flexible body 11 with respect to the second axis 113 towards the first direction is greater than or equal to the bending degree threshold, a deformation of the flexible body 11 with respect to the first axis 111 is determined to be the third deformation. On a condition that the bending degree of the flexible body 11 with respect to the second axis 113 towards the second direction is greater than or equal to the bending degree threshold, a deformation of the flexible body 11 with respect to the second axis 113 is determined to be the fourth deformation.

The control unit 13 is further operated to transfer, according to the third deformation of the flexible body 11 with respect to the second axis 113, a third control instruction to the user terminal; or transfer, according to the fourth deformation of the flexible body 11 with respect to the second axis 113, a fourth control instruction to the user terminal.

The third control instruction and the fourth control instruction are respectively operated to control different functions of the user terminal.

For example, the different functions of the user terminal may control the user terminal to start different customized application, such as a music application, a voice assistant application, and so on. On a condition that a deformation of the flexible body 11 with respect to the second axis 113 is determined to the third deformation, the control unit 13 is triggered to transfer a control instruction of starting music application to the user terminal. On a condition that a deformation of the flexible body 11 with respect to the second axis 113 is determined to be the fourth deformation, the control unit 13 is triggered to transfer a control instruction of starting voice assistant application to the user terminal.

Figure 8:
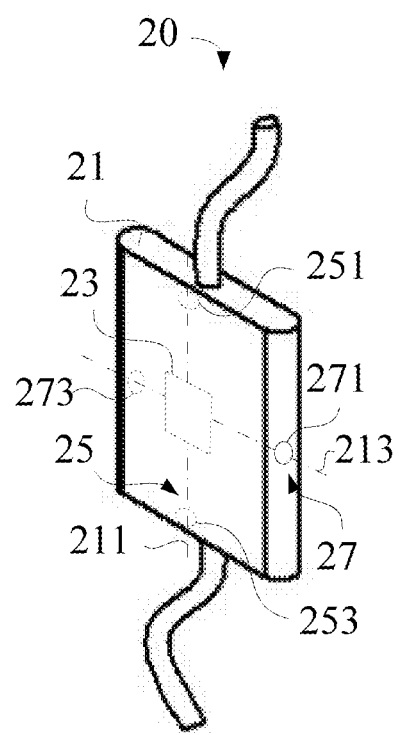
FIG. 8 is a schematic structure diagram of a line control device in accordance with another embodiment of the present disclosure.

Referring to FIG. 8, in another embodiment of the present disclosure, a line control device 20 is provided. The line control device 20 includes a flexible body 21, a control unit 23 arranged in the flexible body 21, a first deformation detection unit 25 arranged along a first axis 211 of the flexible body 21, and a second deformation detection unit 27 arranged along a second axis 213 of the flexible body 21. The first deformation detection unit 25 and the second deformation detection unit 27 are both electrically connected to the control unit 23. The first deformation detection unit 25 is operated to detect deformation of the flexible body 21 with respect to the first axis 211 and trigger, according to a deformation of the flexible body 21 with respect to the first axis 211 to control the user terminal, the control unit 23. The second deformation detection unit 27 is operated to detect deformation of the flexible body 21 with respect to the second axis 213 and trigger, according to a deformation of the flexible body 21 with respect to the second axis 213, the control unit 23 to control the user terminal. The first axis 211 is orthogonal to the second axis 213.

In the embodiment, the difference between the line control device 20 and the line control device 10 illustrated in FIG. 1 is that the first deformation detection unit 25 includes a first proximity sensor 251 and a second proximity sensor 253. The first proximity sensor 251 and the second proximity sensor 253 are arranged at two opposite ends of the flexible body 21 along the first axis 211. The two opposite ends of the flexible body 21 intersect with the first axis 211.

The first proximity sensor 251 and the second proximity sensor 253 are operated to detect a proximity of the two opposite ends of the flexible body 21 along the first axis 211 when the flexible body 21 is bent towards the first direction, and trigger, according to the proximity of the two opposite ends of the flexible body 21 along the first axis 211, the control unit 23 to determine a first deformation of the flexible body 21 with respect to the first axis 211; or detect a proximity of the two opposite ends of the flexible body 21 along the first axis 211 when the flexible body 21 is bent towards the second direction, and trigger, according to the proximity of the two opposite ends of the flexible body 21 along the first axis 211, the control unit 23 to determine a second deformation of the flexible body 21 with respect to the first axis 211.

The second deformation detection unit 27 includes a third proximity sensor 271 and a fourth proximity sensor 273. The third proximity sensor 271 and the fourth proximity sensor 273 are arranged at two opposite ends of the flexible body 21 along the second axis 213. The two opposite ends of the flexible body 21 intersect with the second axis 213.

The third proximity sensor 271 and the fourth proximity sensor 273 are operated to detect a proximity of the two opposite ends of the flexible body 23 along the second axis 213 when the flexible body 21 is bent towards the first direction, and trigger, according to the proximity of the two opposite ends of the flexible body 21 along the second axis 213, the control unit 23 to determine a third deformation of the flexible body 21 with respect to the second axis 213; or detect a proximity of the two opposite ends of the flexible body 21 along the second axis 213 when the flexible body 21 is bent towards the second direction, and trigger, according to the proximity of the two opposite ends of the flexible body 21 along the second axis 213, the control unit 23 to determine a fourth deformation of the flexible body 21 with respect to the second axis 213. The first direction is opposite to the second direction. For example, the first direction and the second direction are opposite to each other and perpendicular to a plane defined by the first axis 211 and the second axis 213.

It can be understood that the control unit 23 may determine a deformation of the flexible body 21 with respect to the first axis 211 or the second axis 213 according to preset proximity thresholds. For example, on a condition that the proximity of the flexible body 21 with respect to the first axis 211 towards the first direction is greater than or equal to the proximity threshold, a deformation of the flexible body 21 with respect to the first axis 211 is determined to be the first deformation. On a condition that the proximity of the flexible body 21 with respect to the first axis 211 towards the second direction is greater than or equal to the proximity threshold, a deformation of the flexible body 21 with respect to the first axis 211 is determined to be the second deformation is determined.

Figure 9:
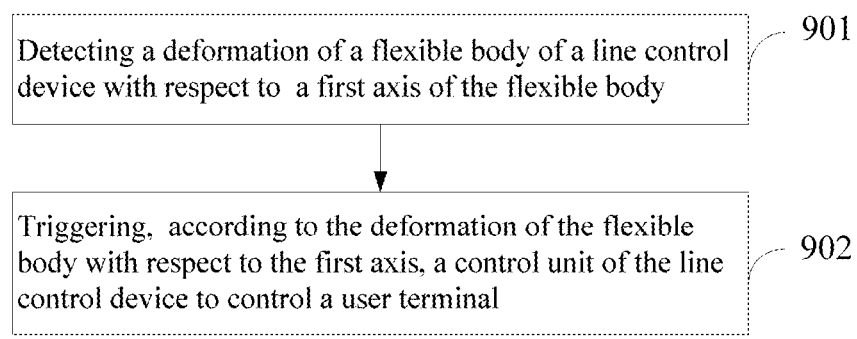
FIG. 9 is a first flowchart of a line control method for a user terminal in accordance with an embodiment of the present disclosure.

FIG. 9 illustrates a first flowchart of a line control method for a user terminal in accordance with an embodiment of the present disclosure. The line control method includes the operations at blocks illustrated in FIG. 9.

Block 901: detecting a deformation of a flexible body of a line control device with respect to a first axis of the flexible body.

Block 902: triggering, according to a deformation of the flexible body with respect to the first axis, a control unit of the line control device to control a user terminal.

The operation of detecting a deformation of a flexible body of a line control device with respect to a first axis of the flexible body, includes detecting a bending degree of the flexible body with respect to the first axis towards a first direction and determining a first deformation of the flexible body with respect to the first axis; or detecting a bending degree of the flexible body with respect to the first axis towards a second direction and determining a second deformation of the flexible body with respect to the first axis according to the bending degree of the flexible body with respect to the first axis towards the second direction.

The operation of detecting a deformation of a flexible body of a line control device with respect to a first axis of the flexible body, includes detecting a proximity of two opposite ends of the flexible body along the first axis when the flexible body is bent towards a first direction, and determining a first deformation of the flexible body with respect to the first axis according to the proximity of the two opposite ends of the flexible body along the first axis; or detecting a proximity of two opposite ends of the flexible body along a first axis when the flexible body is bent towards a second direction, and determining a second deformation of the flexible body with respect to the first axis according to the proximity of the opposite ends of the flexible body along the first axis.

Figure 10:
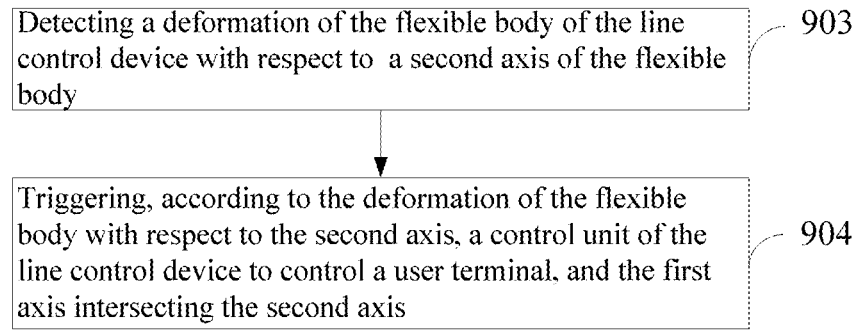
FIG. 10 is a second flowchart of a line control method for a user terminal in accordance with an embodiment of the present disclosure.

FIG. 10 illustrates a second flowchart of a line control method for a user terminal in accordance with an embodiment of the present disclosure. The line control method further includes the operations at blocks illustrated in FIG. 10.

Block 903: detecting a deformation of the flexible body of the line control device with respect to a second axis of the flexible body.

Block 904: triggering, according to a deformation of the flexible body with respect to the second axis, the control unit of the line control device to control the user terminal, and the first axis intersecting the second axis.

The operation of detecting a deformation of the flexible body of the line control device with respect to a second axis of the flexible body, includes detecting a bending degree of the flexible body with respect to the second axis towards the first direction, and determining a third deformation of the flexible body with respect to the second axis according to the bending degree of the flexible body with respect to the second axis towards the first direction; or detecting a bending degree of the flexible body with respect to the second axis towards a second direction and determining a fourth deformation of the flexible body with respect to the second axis according to the bending degree of the flexible body with respect to the second axis towards the second direction.

The operation of detecting a deformation of the flexible body of the line control device with respect to a second axis of the flexible body, includes detecting a proximity of two opposite ends of the flexible body along the second axis when the flexible body is bent towards the first direction, and determining a third deformation of the flexible body with respect to the second axis according to the proximity of the two opposite ends of the flexible body along the second axis; or detecting a proximity of two opposite ends of the flexible body along the second axis when the flexible body is bent towards a second direction, and determining a fourth deformation of the flexible body with respect to the second axis according to the proximity of the opposite ends of the flexible body along the second axis.

The operation of triggering, according to a deformation of the flexible body with respect to the second axis, the control unit of the line control device to control the user terminal, includes triggering, according to the first deformation of the flexible body with respect to the first axis, the control unit to transfer a first control instruction to the user terminal; or triggering, according to the second deformation of the flexible body with respect to the first axis the control unit to transfer a second control instruction to the user terminal.

The first control instruction and the second control instruction are respectively operated to control opposite functions of the user terminal.

The operation of triggering, according to a deformation of the flexible body with respect to the second axis, the control unit of the line control device to control the user terminal, includes triggering, according to the third deformation of the flexible body with respect to the second axis, the control unit to transfer a third control instruction to the user terminal; or triggering, according to fourth deformation of the flexible body with respect to the second axis, the control unit to transfer a fourth control instruction to the user terminal.

The third control instruction and the fourth control instruction are respectively operated to control different functions of the user terminal.

The line control method further includes receiving a touch control instruction for the line control device from a flexible touch screen; and triggering, according the touch control instruction to control the user terminal, the control unit of the line control device.

It can be understood that specific implementations of each operation in the embodiments of the line control method illustrated in FIG. 9 and FIG. 10 may also refer to related descriptions in the embodiments of the line control device illustrated in FIG. 1 to FIG. 7. Details are not described herein again.

The line control device and the line control method for the user terminal arrange the first deformation detection unit in the flexible body, and the first deformation detection unit is arranged along the first axis of the flexible body, so that a deformation of the flexible body with respect to the first axis can be detected by the first deformation detection module and the control unit is triggered, according to a deformation of the flexible body with respect to the first axis, to control the user terminal accordingly. Therefore, the function control of the user terminal performed by the line control device, a pressure may be directly applied to the flexible body along the first axis, without considering the position of keys or the position of touch panels, which will be benefit to enrich the line control operation gestures, and improve the function control efficiency and the user's experience.

It is to be understood that "A along B" described in the embodiments of the present disclosure means that an extending direction of A is the same as or similar to an extending direction of B. That is, a angle between the extending direction of A and the extending direction of B is less than 90 degrees, which can also be considered as "A along B".

Described in detail above are merely preferred embodiments of the present disclosure, and should not be construed as limiting the present disclosure. Those skilled in the art may understand all or part of the processes for implementing the above embodiments. Equivalent variations made according to the claims of the present disclosure still within the scope of the present disclosure.

What is claimed is:

1. A line control device, operated to control a user terminal, the line control device comprising a flexible body, a control unit arranged in the flexible body, a first deformation detection unit arranged along a first axis of the flexible body, and a second deformation detection unit arranged along a second axis of the flexible body perpendicularly intersecting with the first axis, the first deformation detection unit electronically connected to the control unit, the first deformation detection unit operated to detect a deformation of the flexible body with respect to the first axis, and the control unit operated to transfer a control instruction to the user terminal according to the deformation of the flexible body with respect to the first axis, the second deformation detection unit electronically connected to the control unit, the second deformation detection unit operated to detect a deformation of the flexible body with respect to the second axis, and the control unit operated to transfer another control instruction to the user terminal according to the deformation of the flexible body with respect to the second axis.

2. The line control device according to claim 1, wherein the first deformation detection unit detects a bending degree of the flexible body with respect to the first axis, and the control unit controls the user terminal according to the bending degree of the flexible body with respect to the first axis.

3. The line control device according to claim 1, wherein the first deformation detection unit is a first flex sensor arranged along the first axis, and the first flex sensor is operated to:
  detect a bending degree of the flexible body with respect to the first axis towards a first direction, and trigger, according to the bending degree of the flexible body with respect to the first axis towards the first direction, the control unit to determine a first deformation of the flexible body with respect to the first axis; or
  detect a bending degree of the flexible body with respect to the first axis towards a second direction opposite to the first direction, and trigger, according to the bending degree of the flexible body with respect to the first axis towards the second direction, the control unit to determine a second deformation of the flexible body with respect to the first axis.

4. The line control device according to claim 1, wherein the first deformation detection unit comprises a first proximity sensor and a second proximity sensor, the first and the second proximity sensor are arranged at two opposite ends of the flexible body along the first axis, and the first proximity sensor and the second proximity sensor are operated to:
  detect a proximity of the two opposite ends of the flexible body along the first axis when the flexible body is bent towards a first direction, and trigger, according to the proximity of the two opposite ends of the flexible body along the first axis, the control unit to determine a first deformation of the flexible body with respect to the first axis; or
  detect a proximity of the two opposite ends of the flexible body along the first axis when the flexible body is bent towards a second direction opposite to the first direction, and trigger, according to the proximity of the two opposite ends of the flexible body along the first axis, the control unit to determine a second deformation of the flexible body with respect to the first axis according to the proximity of the two opposite ends of the flexible body along the first axis.

5. The line control device according to claim 4, wherein the second deformation detection unit is a second flex sensor arranged along the second axis, and the second flex sensor is operated to:
  detect a bending degree of the flexible body with respect to the second axis towards the first direction, and trigger, according to the bending degree of the flexible body with respect to the second axis towards the first direction, the control unit to determine a third deformation of the flexible body with respect to the second axis; or
  detect a bending degree of the flexible body with respect to the second axis towards the second direction, and trigger, according to the bending degree of the flexible body with respect to the second axis towards the second direction, the control unit to determine a fourth deformation of the flexible body with respect to the second axis.

6. The line control device according to claim 5, wherein the control unit is further operated to:
  transfer a third control instruction to the user terminal according to the third deformation of the flexible body with respect to the second axis; or
  transfer a fourth control instruction to the user terminal according to the fourth deformation of the flexible body with respect to the second axis; wherein the third control instruction and the fourth control instruction are respectively operated to control different functions of the user terminal.

7. The line control device according to claim 4, wherein the second deformation detection unit comprises a third proximity sensor and a fourth proximity sensor, and the third proximity sensor and the fourth proximity sensor are arranged at two opposite ends of the flexible body along the second axis, the third proximity sensor and the fourth proximity sensor are operated to:
  detect a proximity of the two opposite ends of the flexible body along the second axis when the flexible body is bent towards the first direction, and trigger, according to the proximity of the two opposite ends of the flexible body along the second axis, the control unit to determine a third deformation of the flexible body with respect to the second axis; or
  detect a proximity of the two opposite ends of the flexible body along the second axis when the flexible body is bent towards the second direction, and trigger, according to the proximity of the two opposite ends of the flexible body along the second axis, the control unit to determine a fourth deformation of the flexible body with respect to the second axis.

8. The line control device according to claim 4, wherein the first control instruction and the second control instruction are respectively operated to control opposite functions of the user terminal.

9. The line control device according to claim 4, wherein the flexible body is a rectangular plate, and the first axis of the flexible body and the second axis of the flexible body respectively extend along a length direction of the flexible body and a width direction of the flexible body.

10. The line control device according to claim 1, further comprising a flexible touch screen electronically connected to the control unit, wherein at least one portion of the flexible touch screen covers on a surface of the flexible body operated to receive a touch control instruction for the line control device, and further trigger, according to the touch control instruction to control the user terminal, the control unit.

11. A line control method for a user terminal comprising:
  detecting a deformation of a flexible body of the user terminal with respect to a first axis of the flexible body;

detecting a deformation of the flexible body with respect to a second axis of the flexible body perpendicularly intersecting with the first axis; and triggering, according to the deformation of the flexible body with respect to the first axis and the deformation of the flexible body with respect to the second axis, a control unit of the user terminal to control the user terminal.

12. The line control method according to claim 11, wherein the operation of detecting a deformation of a flexible body of the user terminal with respect to a first axis of the flexible body, comprising:

detecting a bending degree of the flexible body with respect to the first axis towards a first direction, and triggering, according to the bending degree of the flexible body with respect to the first axis towards a first direction, the control unit to determine a first deformation of the flexible body with respect to the first axis; or detecting a bending degree of the flexible body with respect to the first axis towards a second direction opposite to the first direction, and triggering, according to the bending degree of the flexible body with respect to the first axis towards the second direction, the control unit to determine a second deformation of the flexible body with respect to the first axis.

13. The line control method according to claim 11, wherein the operation of detecting a deformation of a flexible body of the user terminal with respect to a first axis of the flexible body, comprising:

detecting a proximity of the two opposite ends of the flexible body along the first axis when the flexible body is bent towards a first direction, and triggering, according to the proximity of the two opposite ends of the flexible body along the first axis, the control unit to determine a first deformation of the flexible body with respect to the first axis; or detecting a proximity of the two opposite ends of the flexible body along the first axis when the flexible body is bent towards a second direction opposite to the first direction, and triggering, according to the proximity of the two opposite ends of the flexible body along the first axis, the control unit to determine a second deformation of the flexible body with respect to the first axis.

14. The line control method according to claim 13, wherein the operation of detecting a deformation of the flexible body with respect to a second axis of the flexible body perpendicularly intersecting with the first axis, comprising:

detecting a bending degree of the flexible body with respect to the second axis towards the first direction, and triggering, according to the bending degree of the flexible body with respect to the second axis towards the first direction, the control unit to determine a third deformation of the flexible body with respect to the second axis; or detecting a bending degree of the flexible body with respect to the second axis towards the second direction, and triggering, according to the bending degree of the flexible body with respect to the second axis towards the second direction, the control unit to determine a fourth deformation of the flexible body with respect to the second axis.

15. The line control method according to claim 14, further comprising:

transferring a third control instruction to the user terminal according to the third deformation of the flexible body with respect to the second axis; or transferring a fourth control instruction to the user terminal according to the fourth deformation of the flexible body with respect to the second axis; wherein the third control instruction and the fourth control instruction are respectively operated to control different functions of the user terminal.

16. The line control method according to claim 13, wherein the operation of detecting a deformation of the flexible body with respect to a second axis of the flexible body perpendicularly intersecting with the first axis, comprising:

detecting a proximity of the two opposite ends of the flexible body along the second axis when the flexible body is bent towards the first direction, and triggering, according to the proximity of the two opposite ends of the flexible body along the second axis, the control unit to determine a third deformation of the flexible body with respect to the second axis; or detecting a proximity of the two opposite ends of the flexible body along the second axis when the flexible body is bent towards the second direction, and triggering, according to the proximity of the opposite ends of the flexible body along the second axis, the control unit to determine a fourth deformation of the flexible body with respect to the second axis.

17. The line control method according to claim 13, further comprising:

transferring a first control instruction to the user terminal according to the first deformation of the flexible body with respect to the first axis; or transferring a second control instruction to the user terminal according to the second deformation of the flexible body with respect to the first axis, and wherein the first control instruction the second control instruction are respectively operated to control opposite functions of the user terminal.

18. The line control method according to claim 13, further comprising:

receiving a touch control instruction for the line control device from a touch screen; and triggering, according to the touch control instruction, the control unit to control the user terminal.

19. The line control method according to claim 13, wherein the flexible body is a rectangular plate, and the first axis of the flexible body and the second axis of the flexible body respectively extend along a length direction of the flexible body and a width direction of the flexible body.

* * * * *